United States Patent
Yoon et al.

(10) Patent No.: US 6,838,341 B2
(45) Date of Patent: Jan. 4, 2005

(54) METHOD FOR FABRICATING SEMICONDUCTOR DEVICE WITH SELF-ALIGNED STORAGE NODE

(75) Inventors: Jae-Man Yoon, Seoul (KR); Yun-Jae Lee, Seoul (KR); Sang-Hyun Lee, Seoul (KR); Wook-Je Kim, Seoul (KR)

(73) Assignee: Samsung Electronic Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/688,079

(22) Filed: Oct. 16, 2003

(65) Prior Publication Data

US 2004/0152246 A1 Aug. 5, 2004

(30) Foreign Application Priority Data

Oct. 16, 2002 (KR) .................................. 10-2002-0063266

(51) Int. Cl.[7] .......................................... H01L 21/8242
(52) U.S. Cl. ...................................... 438/255; 438/398
(58) Field of Search ................................ 438/255, 253, 438/254, 396, 397, 398, 439, 443, 680, 689, 706, 745

(56) References Cited

U.S. PATENT DOCUMENTS 6,144,095 A  * 11/2000  Sandhu et al. ............... 257/750
6,268,246 B1 *  7/2001  Ukita et al. .................. 438/253
6,432,795 B1 *  8/2002  Lee ............................. 438/398
6,696,713 B2 *  2/2004  Ishibashi ..................... 257/296

FOREIGN PATENT DOCUMENTS

KR       2001-45911         6/2001

OTHER PUBLICATIONS

English language of Abstract for Korean Patent Publication No. 2001–45911, filed Jun. 5, 2003.

* cited by examiner

*Primary Examiner*—David Nhu
(74) *Attorney, Agent, or Firm*—Marger Johnson & McCollom, P.C.

(57) ABSTRACT

A method for fabricating a semiconductor device includes preparing a semiconductor substrate having a contact pad; forming a first insulating film having a storage node contact exposing the contact pad and having a stack structure of an upper interlayer insulating film, a bottom interlayer insulating film, and an etching stopper between the upper and bottom interlayer insulating layers that protrudes into the storage node contact; forming a first conductive film for a storage node on the substrate; forming a second insulating film where a portion of a surface corresponding to the storage node contact is recessed; forming an etching mask layer on the recessed portion of the second insulating film; etching the second insulating film using the etching mask layer; forming a second conductive film for a storage node on the substrate; etching the first and second conductive films to isolate nodes; and removing the etching mask layer, the second insulating film and the upper interlayer insulating film.

14 Claims, 13 Drawing Sheets

METHOD FOR FABRICATING SEMICONDUCTOR DEVICE WITH SELF-ALIGNED STORAGE NODE

CROSS REFERENCE TO RELATED APPLICATIONS

This application claims priority from Korean Patent Application No. 2002-63266, filed on Oct. 16, 2002, the contents of which are hereby incorporated by reference in their entirety.

BACKGROUND OF THE INVENTION

1. Field of the Invention

This disclosure relates to a method of fabricating a semiconductor device, and more particularly, to a method of forming self-aligned storage nodes capable of improving alignment margins with storage node contacts and of improving static capacitance.

2. Description of Related Art

As the integration density and scale-down of semiconductor memory devices increase, the size of a semiconductor memory device continues to decrease. Because of the decrease in the size of the devices, it is difficult to ensure the alignment margin between a storage node contact and a storage node during the exposure for forming the storage node of a capacitor. It is also difficult to achieve a sufficient capacitance owing to the reduction in the dimension of a unit capacitor.

FIGS. 1A through 1D are cross sectional diagrams illustrating a method of fabricating a conventional semiconductor device with a capacitor for a one-cylinder storage (OCS) structure.

Referring to FIG. 1A, a gate (not shown) is formed on a semiconductor substrate 100. A first interlayer insulating film 110 is formed on the substrate, and then etched to form self aligned contacts (SACs) 115 exposing impurity regions (not shown) of a predetermined conductivity type in the semiconductor substrate 100.

A conductive material for a contact pad, such as a polysilicon film, is deposited on the substrate comprising the SACs 115. A chemical mechanical polishing (CMP) process is then performed on the conductive material for node separation. As a result, a storage node contact pad 120 and a bitline contact pad (not shown) are formed in the SACs 115. At this time, the storage node contact pad 120 and the bitline contact pad are in electrical contact with the impurity regions (not shown) via SACs 115.

Next, a second interlayer insulating film 130, a conductive material 141 for a bit line, and a capping material 143 for a bit line such as a nitride film are sequentially deposited on the substrate, and then the conductive material 141 for a bit line and the capping material 143 for a bit line are etched to form a bit line 140 comprised of the conductive material 141 and the capping material 143. The bit line 140 is in contact with a bitline contact pad (not shown).

An insulating film for a spacer, for example, a nitride film, is deposited on the substrate and then etched back to form a spacer 145 on the side wall of the bit line 140. A third interlayer insulating film 150 is deposited on the substrate including the bit line 140 and a CMP process for planarization is performed. The third interlayer insulating film 150 is etched to form a storage node contact 155.

A conducting material for a contact plug, for example, a polysilicon film, is deposited on the substrate including the storage node contact 155 and then is etched by a CMP process and the like to form a contact plug 160. An etching stopper 170 and a sacrificial insulating film 180 are sequentially deposited on the substrate and then the sacrificial insulating film 180 is planarized by the CMP process and the like. The sacrificial insulating film 180 includes an oxide film, and the etching stopper 170 is includes a nitride film.

Referring to FIG. 1B, a photo resistive pattern 190 is formed on the sacrificial insulating film 180 in order to define an area where a storage node is to be formed in a subsequent process. The sacrificial insulating film 180 is etched using the photo resistive film pattern 190. The etching stopper 170 serves as an etching end point. The etching stopper 170 is etched to form an opening 195.

Referring to FIG. 1C, the photo resistive film pattern 190 is removed, and a conductive film for a storage node, for example, a polysilicon film 200, is deposited on the substrate including the opening 195. Referring to FIG. 1D, an undoped silicate glass (USG) (not shown) is deposited on the polysilicon film 200 and etched by an etch back or a CMP process for node isolation. Next, the USG film and the sacrificial insulating film 180 are removed to form a storage node 205 in contact with the contact plug 160.

As described above, the conventional semiconductor device fabrication method forms an opening by photo etching a sacrificial insulating film in order to form the storage node. However, it is difficult to assure the alignment margin with a storage node contact plug owing to the reduction in the size of the device and the associated process cost is expensive. It is difficult to assure the capacitance due to the reduction of the dimension of a unit capacitor.

Korean patent laid open number 2001-45911 discloses a method for fabricating a capacitor that is capable of simplifying the process and increasing the capacitance. This method does not form a contact plug that connects a storage node contact pad with a storage node, but instead forms a storage node that directly contacts the storage node contact pad.

However, this method also forms an opening by photo etching a sacrificial insulating film in order to form a storage node, therefore it is not capable of assuring an alignment margin with a storage node contact.

Embodiments of the invention address these and other limitations of the prior art.

SUMMARY OF THE INVENTION

An embodiment of the invention provides a fabrication method for a semiconductor device with a storage node that is self-aligned with a storage node contact, thereby assuring an alignment margin with the storage node contact and lowering a manufacturing cost.

An embodiment of the invention provides a method for fabricating finer and highly-integrated semiconductor devices by ensuring a sufficient capacitance.

BRIEF DESCRIPTION OF THE DRAWINGS

For a more complete understanding of the invention and the advantages thereof, reference is now made to the following descriptions taken in conjunction with the accompanying drawings, in which like reference numerals designate like elements.

DETAILED DESCRIPTION OF THE INVENTION

A method for fabricating a semiconductor device according to an embodiment of the invention will now be describe with reference to the accompanying drawings.

FIGS. 2A through 2I are process cross sectional diagrams illustrating a method for fabricating a semiconductor device comprising a capacitor having an OCS structure according to an embodiment of the invention.

Figure 1A:
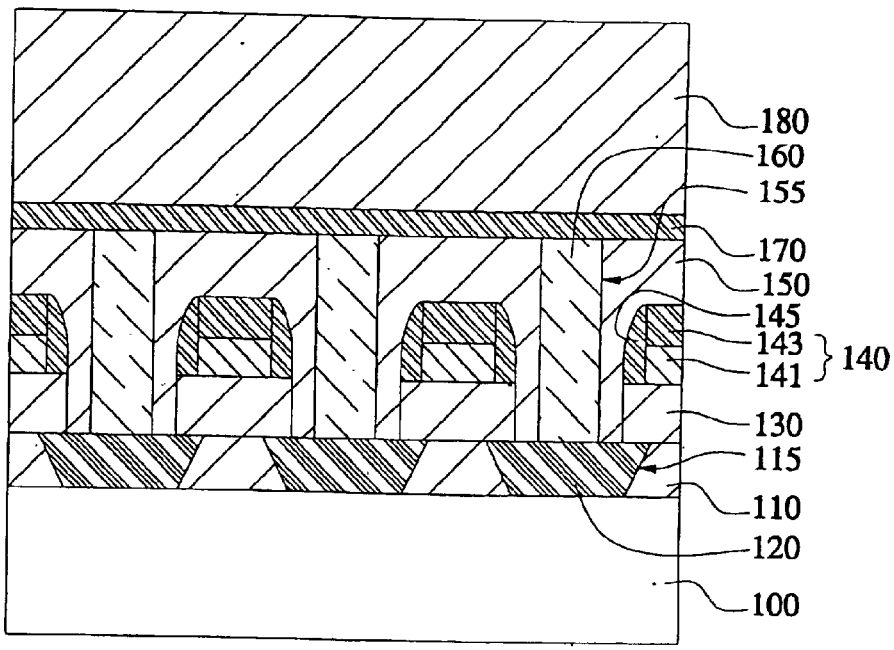
FIGS. 1A through 1D are cross sectional diagrams illustrating a method of fabricating a conventional semiconductor device having an OCS structure.
Figure 1B:
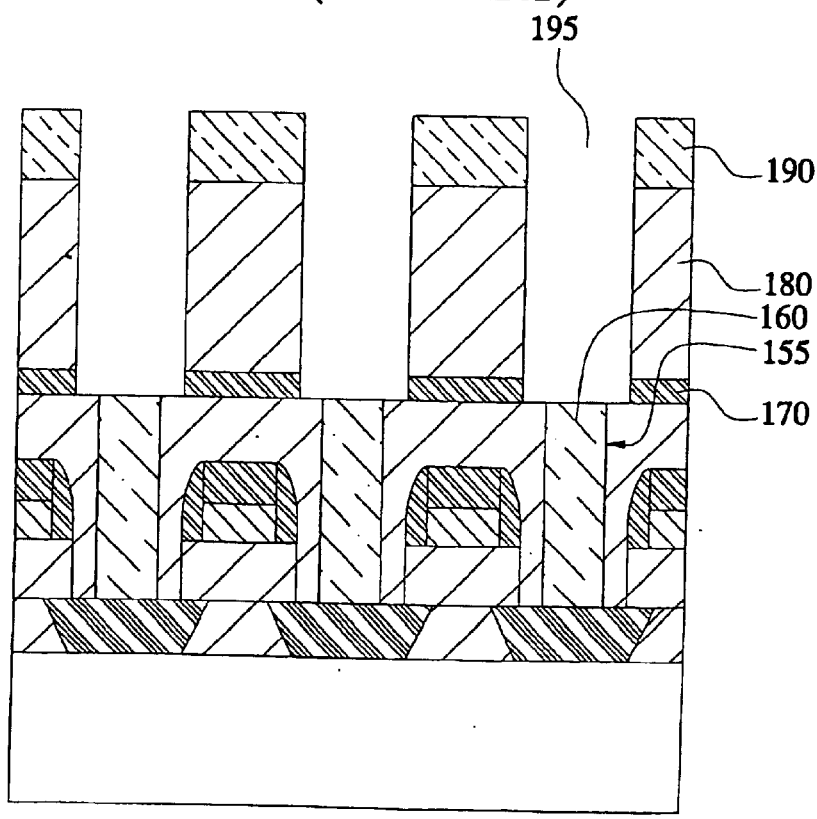
Figure 1C:
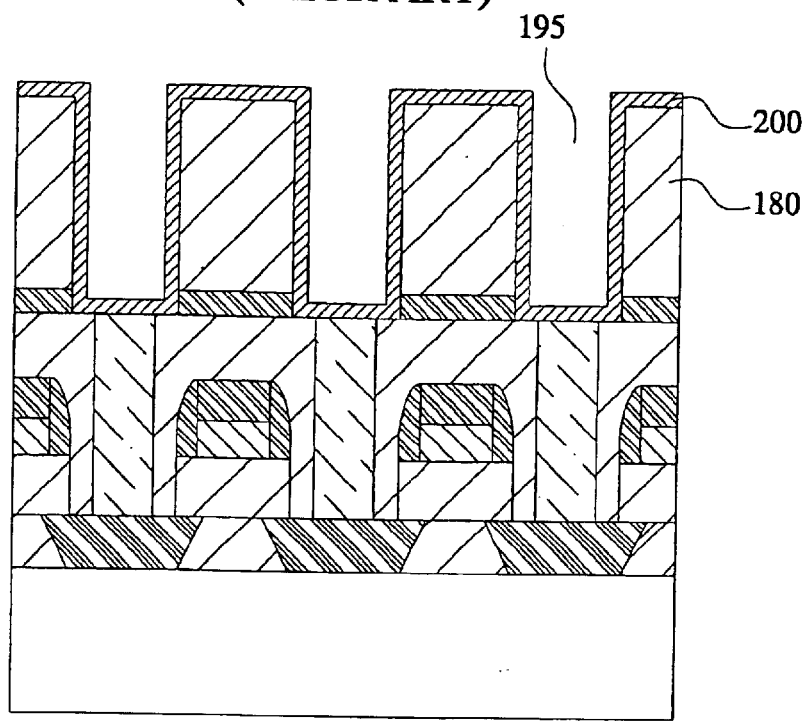
Figure 1D:
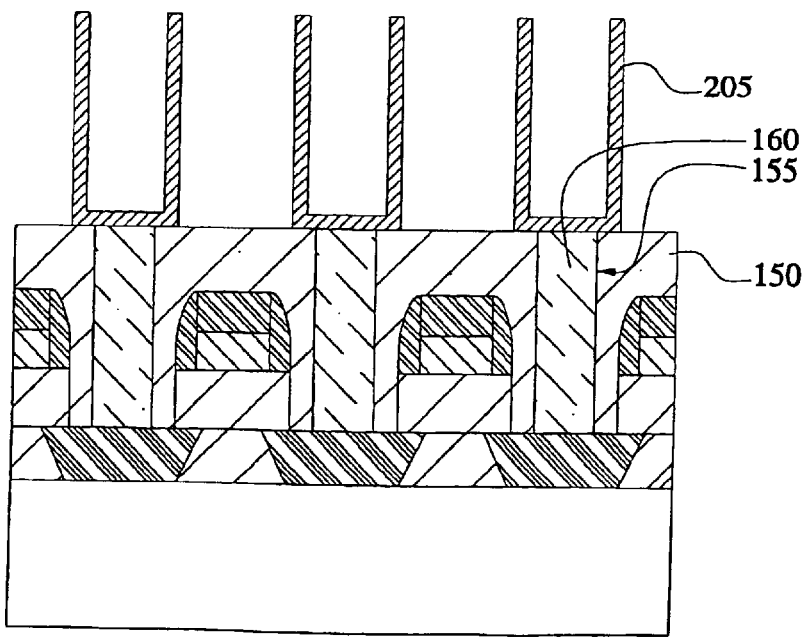
Figure 2A:
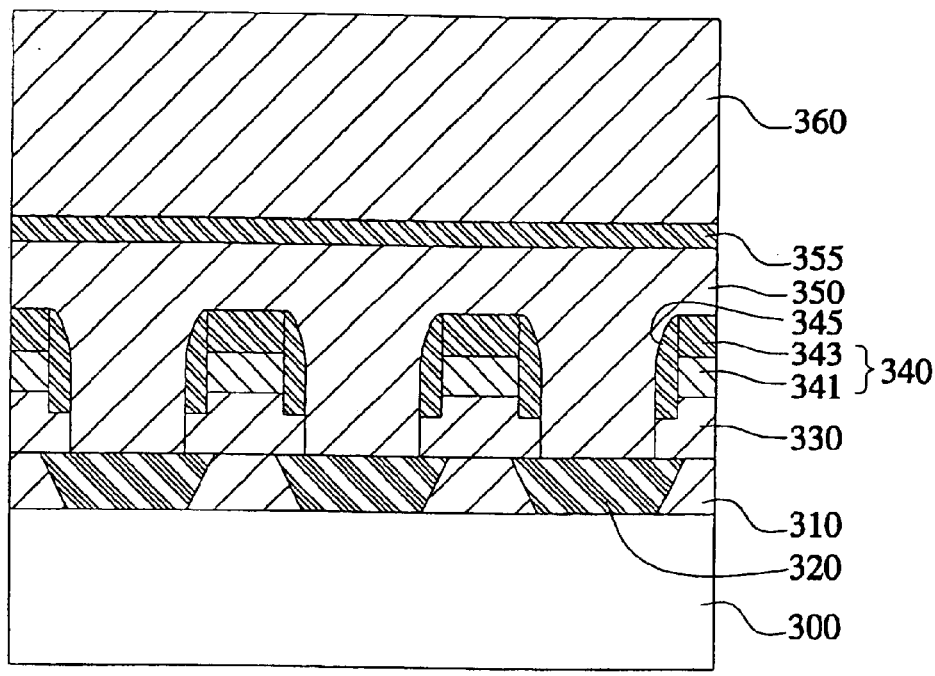
FIGS. 2A through 2I are cross sectional diagrams illustrating a method of fabricating a semiconductor device according to an embodiment of the invention.

Referring to FIG. 2A, a gate (not shown) is formed on a semiconductor substrate 300 and then a high density plasma (HDP) as a first interlayer insulating film 310 is formed on the substrate. Self-aligned contacts (SACs) 315 are formed by self-aligned etching the first interlayer insulating film 310.

Next, a conductive material for a contact pad, for example, a polysilicon film, is deposited on the substrate including the SACs 315, and a CMP process or an etch back process for node separation is performed to form a bitline contact pad (not shown) and a storage node contact pad 320. The storage node contact pad 320 and the bitline contact pad are in electrical contact with impurity regions of a predetermined conductivity type (not shown) formed in the semiconductor substrate 300 via the SACs 315.

A second interlayer insulating film 330, a conductive material 341 for a bit line, and a capping material 343 for a bit line are sequentially deposited on the substrate. The conductive material 341 for a bit line and the capping material 343 for a bit line are etched and then a portion of the second interlayer insulating film 330 is etched. As a result, the bit line 340 including the conductive material 341 and the capping material 343 is formed. The bit line 340 is in contact with the bitline contact pad (not shown).

Next, an insulating film for a spacer is deposited on the substrate and etched back to form a bitline spacer 345 at the sidewall of the bit line 343. A nitride film is used as the capping material 343 for a bit line and the insulating film 345 for a spacer.

A third interlayer insulating film 350 is deposited on the substrate including the bit line 340 and a CMP process for planarization is performed. An etching stopper 355 and a fourth interlayer insulating film 360 are sequentially deposited on the third interlayer insulating film 350. At this time, a HDP oxide film or a BPSG film is used as the third and fourth interlayer insulating films 350 and 360. A nitride film is used as the etching stopper 355.

Figure 2B:
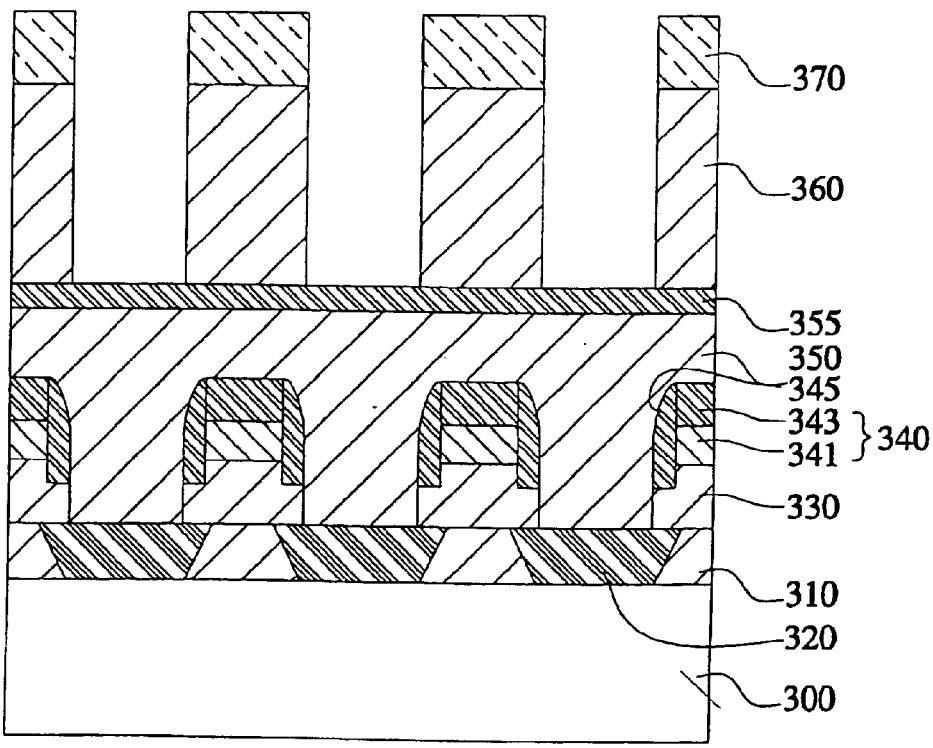

Referring to FIG. 2B, a photo resistive film pattern 370 is formed on the fourth interlayer insulating film 360 to define an area where a storage node contact is to be formed. The fourth interlayer insulating film 360 is dry-etched using the photo resistive film pattern 370. At this time, the first etching stopper 355 serves as an etching end point.

Figure 2C:
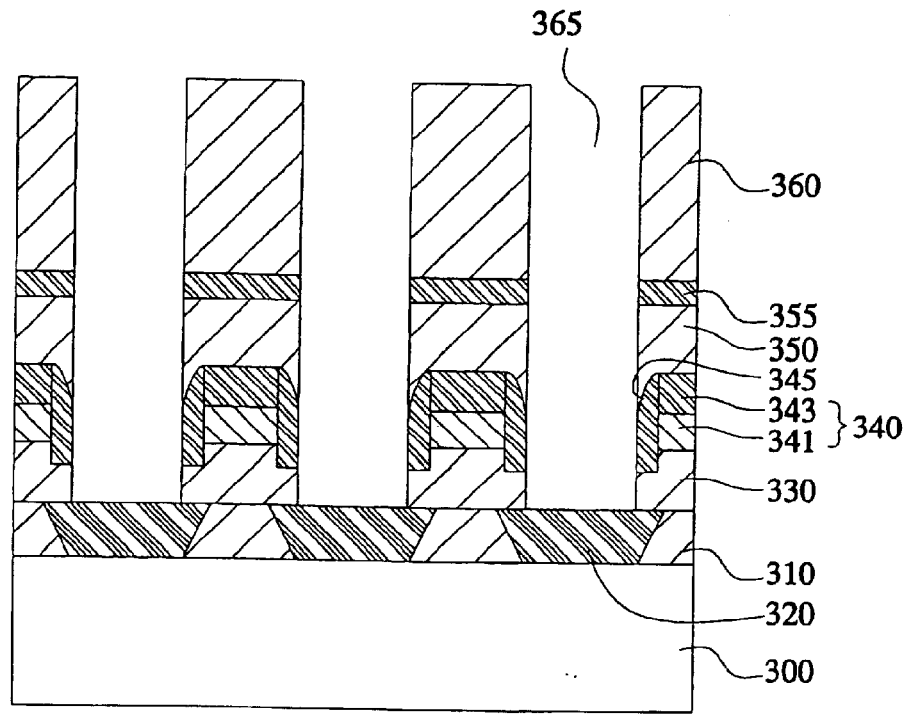

Referring to FIG. 2C, the photo resistive film pattern 370 is removed. The etching stopper 350 and the third interlayer insulating film 350 are dry-etched using the fourth interlayer insulating film 360 to form a storage node contact 365 exposing the storage node contact pad 320.

Figure 2D:
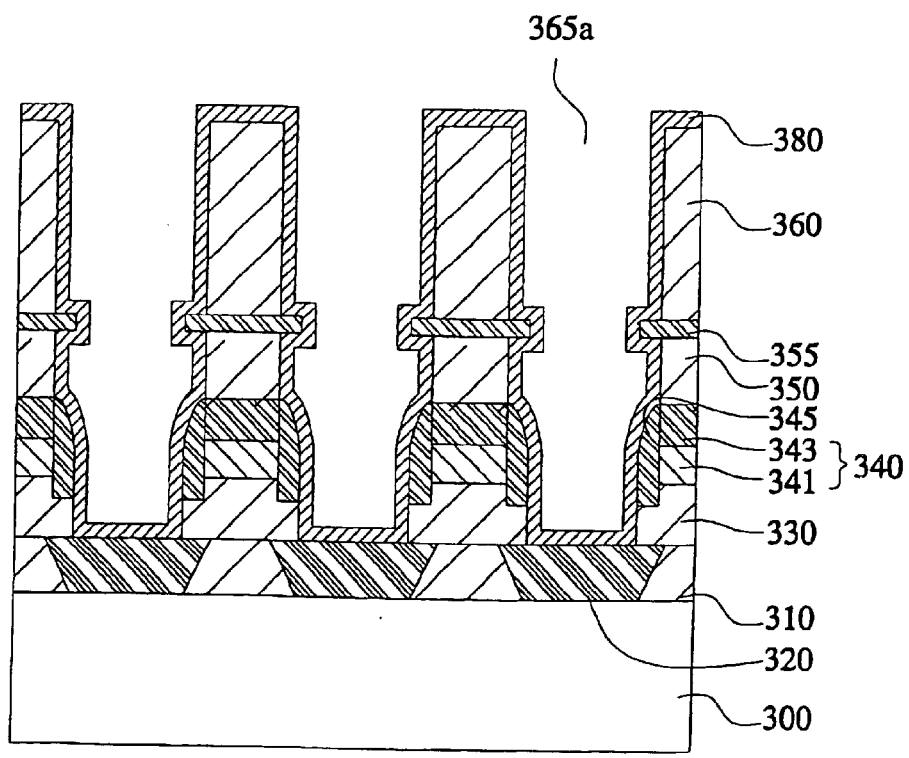

Referring to FIG. 2D, a native oxide film is removed with an HF cleaning process. During the HF cleaning process, since an etching speed of oxide films for the third interlayer insulating film 350 and the fourth interlayer insulating film 360 are higher than a nitride film for the etching stopper 355, an open area of the storage node contact 365a after the HF cleaning process is larger than that of the storage node contact 365 after the dry etching process. Thus, the nitride film for the etching stopper 355 protrudes from the sidewall of the storage node contact 365a.

Figure 3A:
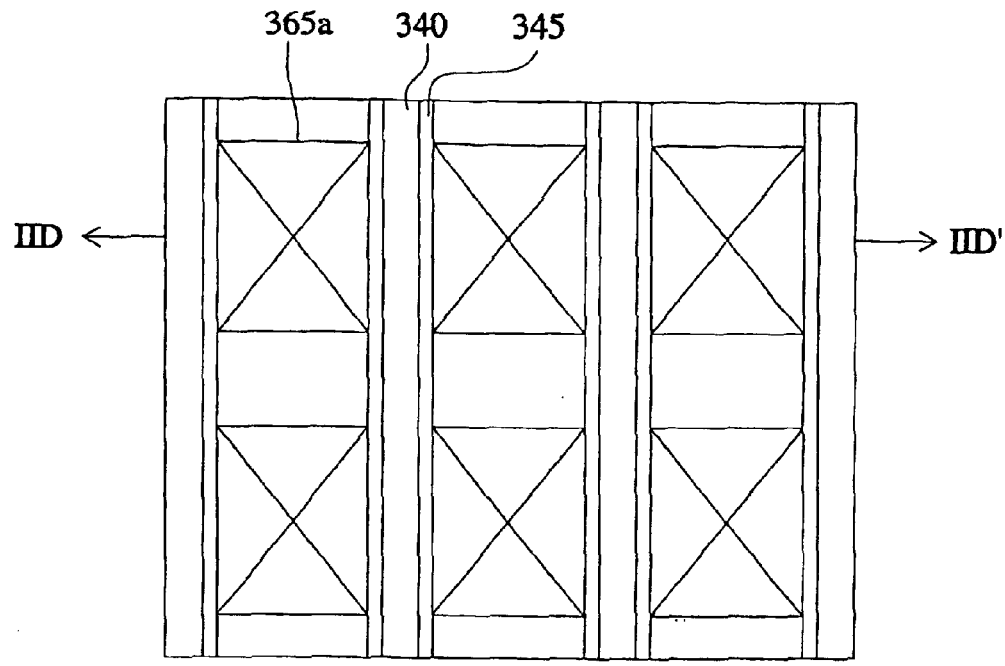
FIG. 3A through FIG. 3D are plan diagrams illustrating a method of fabricating a semiconductor device according to an embodiment of the invention.

FIG. 3A is a plan diagram illustrating the semiconductor device after the storage node contact 365a is formed by the HF cleaning process. FIG. 2C is a cross-sectional diagram taken along a line IID—IID of FIG. 3A after the HF cleaning process.

A first polysilicon film 380 is deposited to a thickness of 200~400 Å on the substrate including the storage node contact 365a. It is desirable that the first polysilicon film 380 is deposited to its minimum thickness in order not to fill the storage node contact 365. It is because it is for forming a void at the bottom of the storage node contact 365a and then forming a recess at an upper surface of a sacrificial insulating film during the deposition of a sacrificial insulating film for forming a storage node.

Figure 2E:
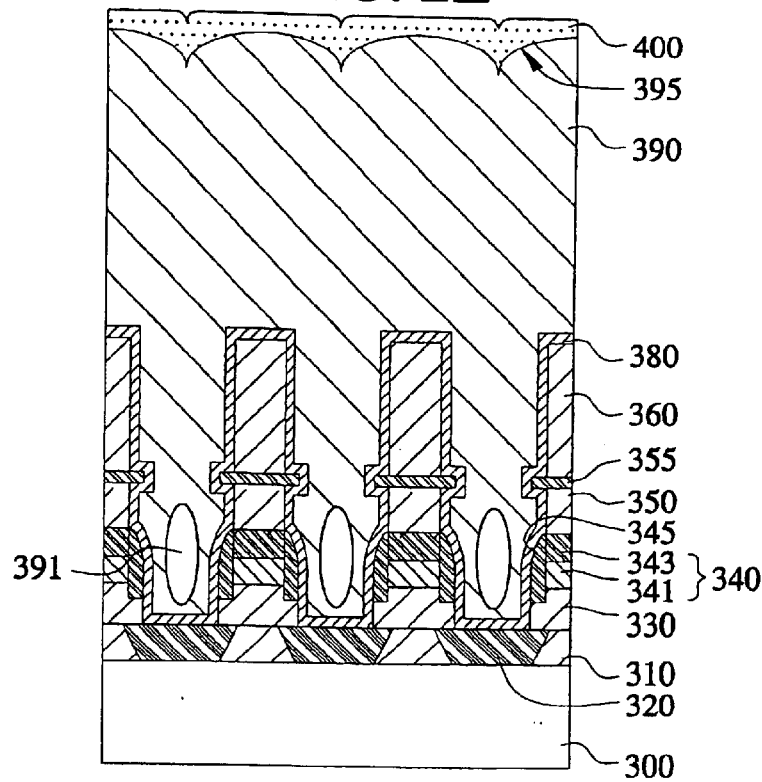

Referring to FIG. 2E, a sacrificial insulating film 390 is formed to a thickness of about 10000~15000 Å on the substrate. The sacrificial insulating film 390 uses an insulating film that copies an undulation produced by the storage node contact 365a on its upper surface. The insulating film may be, for example, a plasma oxide film PEOX, or a high density plasma oxide film.

At this time, in the storage node contact 365a, the first etching stopper 355 is protrudes more than the third and fourth interlayer insulating films 350 and 360. Thus, a void 391 is formed at the bottom of the storage node contact 365a. As a result, the undulation produced by the storage node contact 365a is copied on the sacrificial insulating film 390. Accordingly, the sacrificial insulating film 390 has a recessed portion 395 on its surface corresponding to the storage node contact 365a.

Next, an insulating film 400 is deposited to a thickness of 500~1000 Å on the sacrificial insulating film 390. A nitride film that may gap fill the recessed portion 395 of the sacrificial insulating film 390 and has a wet and dry etching selectivity with respect to the sacrificial insulating film 390 is used as the insulating film 400.

Figure 2F:
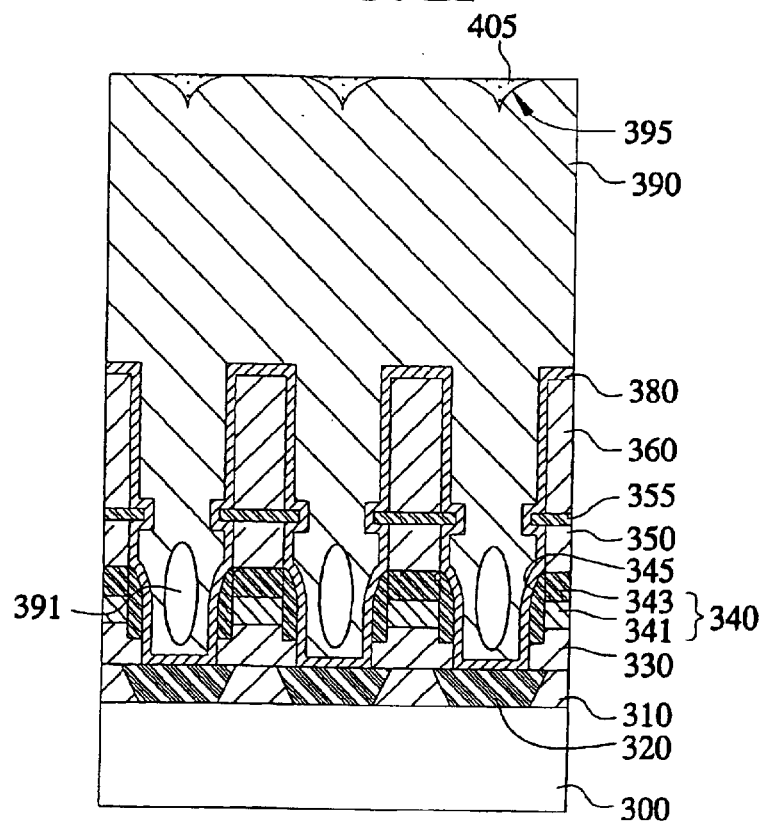
Figure 3B:
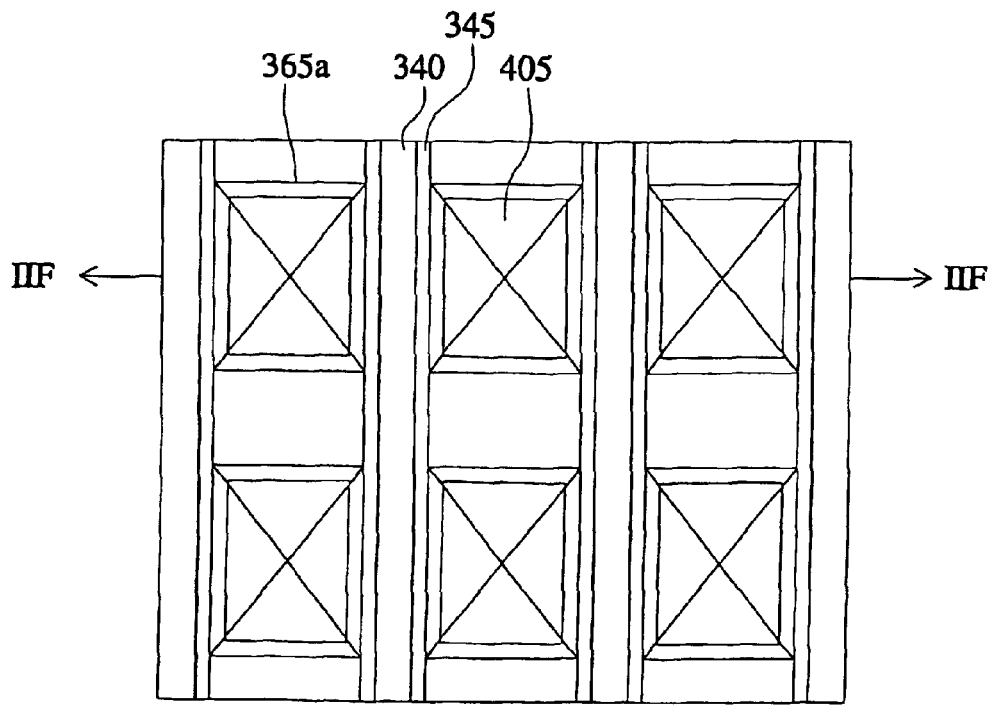

Referring to FIG. 2F, the insulating film 400 is etched by a CMP process using the sacrificial insulating film 390 as an etching end point until a portion of the sacrificial insulating film 390 is exposed. Thus, the insulating film 405 fills in the recessed portion 395 of the sacrificial insulating film 390 that is isolated. FIG. 3B is a plan diagram taken after the CMP process is performed in order for the insulating films 405 to remain only in the recess portion 395 of the sacrificial insulating film 390. FIG. 2F is a cross sectional diagram taken along a line IIF—IIF of FIG. 3B. Referring to FIG. 3B, the insulating film 405 is separately formed in the recessed portion 395 of the sacrificial insulating film corresponding to the storage node contact 365a.

Figure 2G:
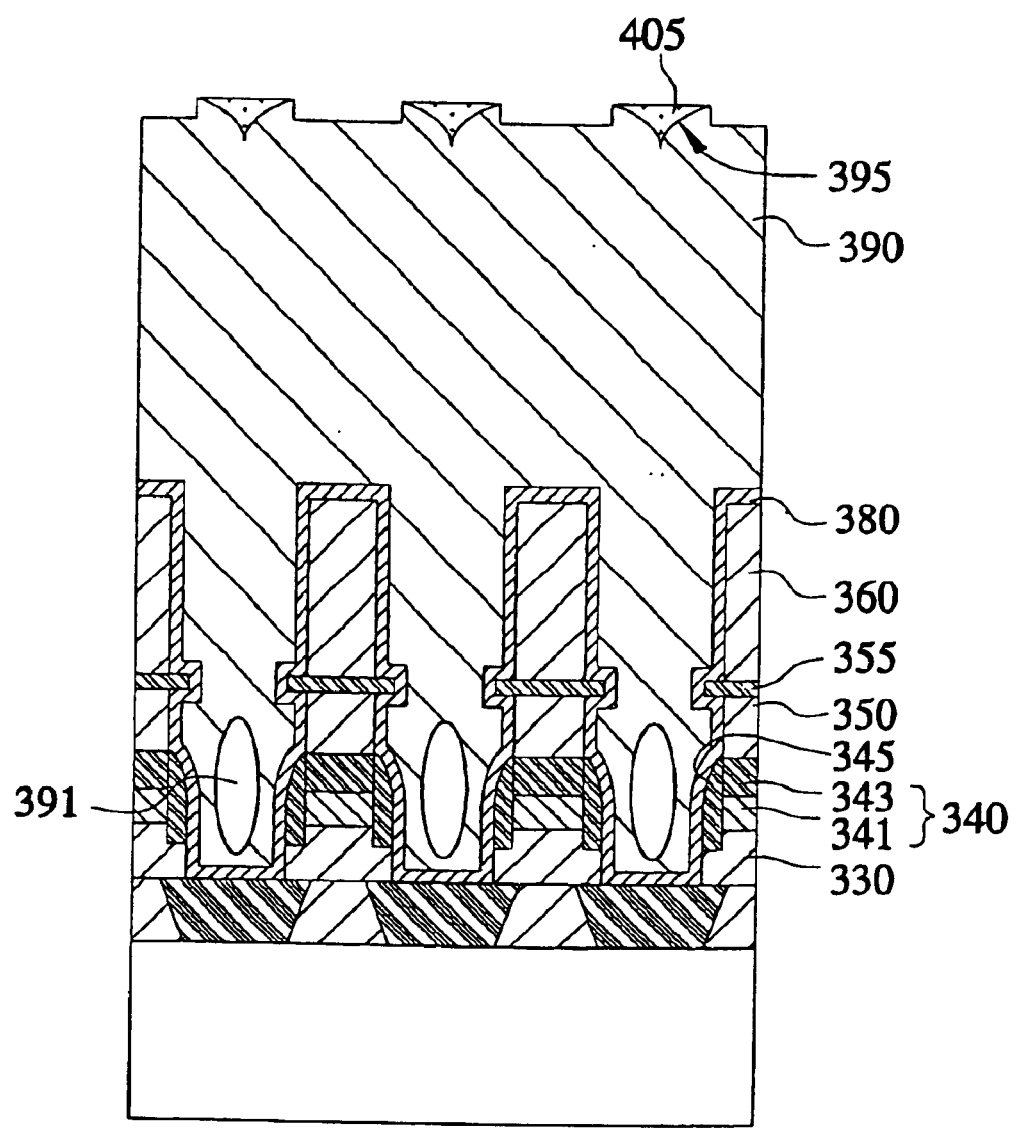

Referring to FIG. 2G, the portion of sacrificial insulating film 390 exposed by the CMP process is etched by a fixed amount through a dry etching process using the insulating film 405 as an etching mask. At this time, the exposed portion of the sacrificial insulating film 390 is etched to a thickness of about 300~1000 Å.

Figure 2H:
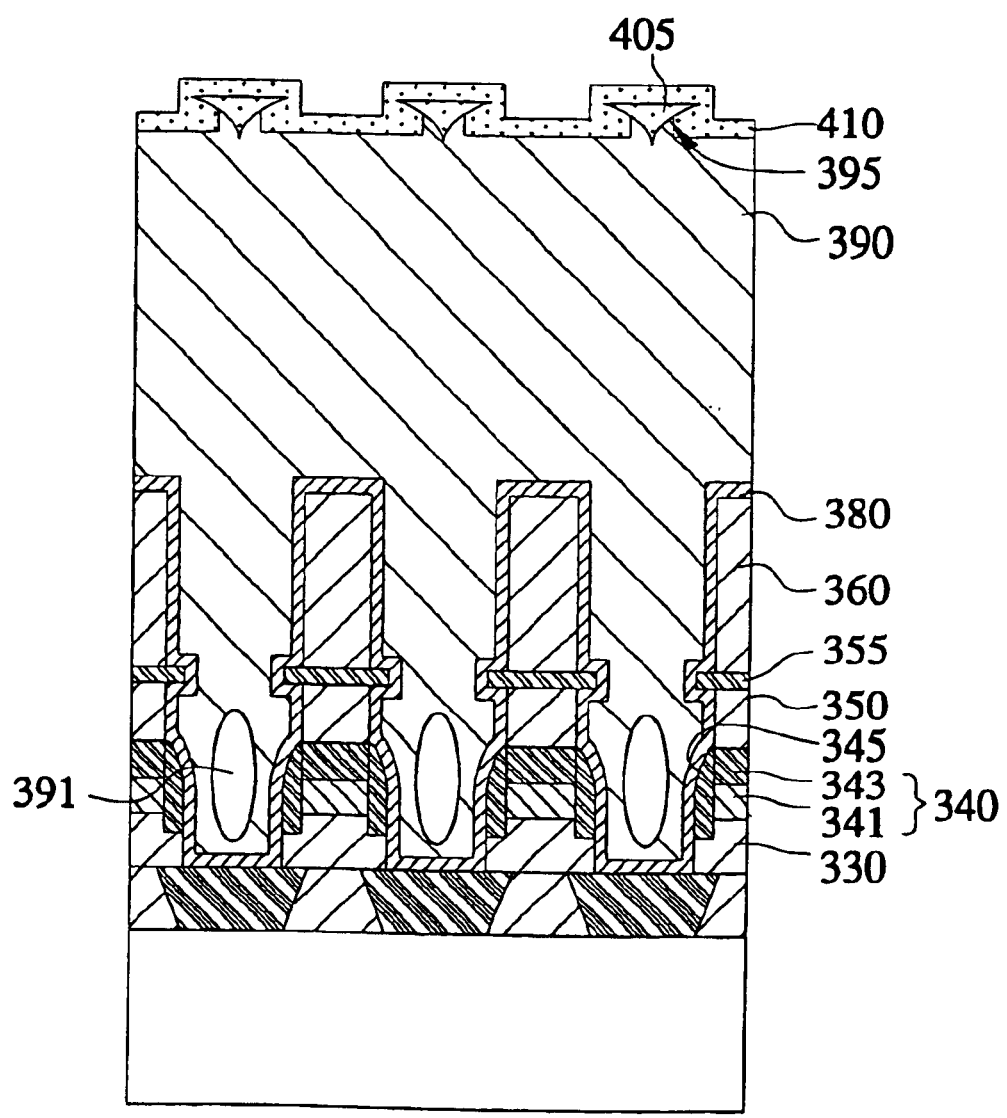

Referring to FIG. 2H, during a cleaning process the sacrificial insulating film 390 is further etched by a fixed amount through a wet etching process using the insulating film 405 as an etching mask. When the sacrificial insulating film 390 is wet etched after dry etching, the sacrificial insulating film 390 is further etched to a thickness of about 100~300 Å within the extent that the insulating film 405 is not lifted.

Next, an insulating film 410 having an etching selectivity with respect to the sacrificial oxide film 390, for example, a nitride film, is deposited on the substrate. The insulating film 410 supports an edge portion of the insulating film 405 that has a thin thickness and it is deposited to a thickness of about 100~300 Å. The thickness of the insulating film 410 becomes a factor for determining a surface dimension of a storage node that is to be formed in a subsequent process.

Figure 2I:
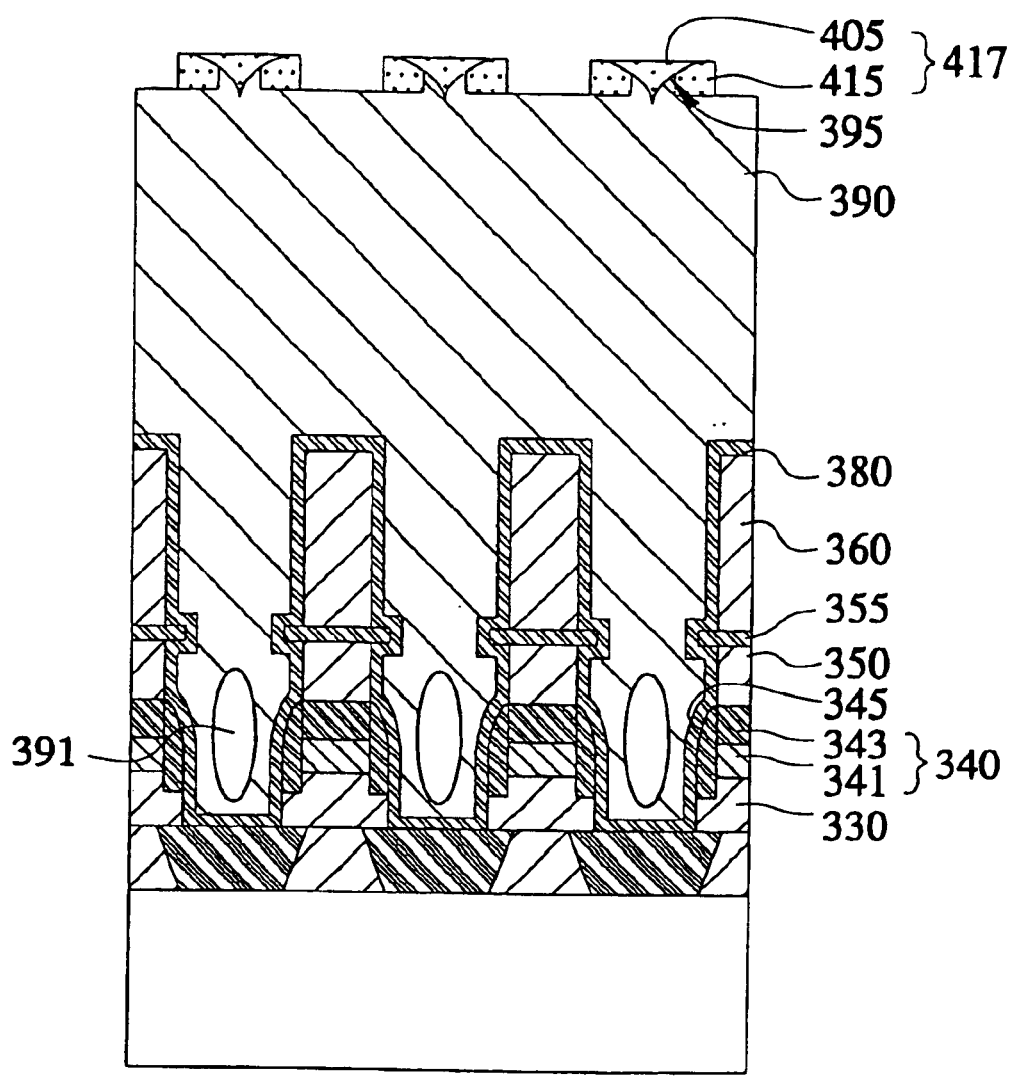
Figure 3C:
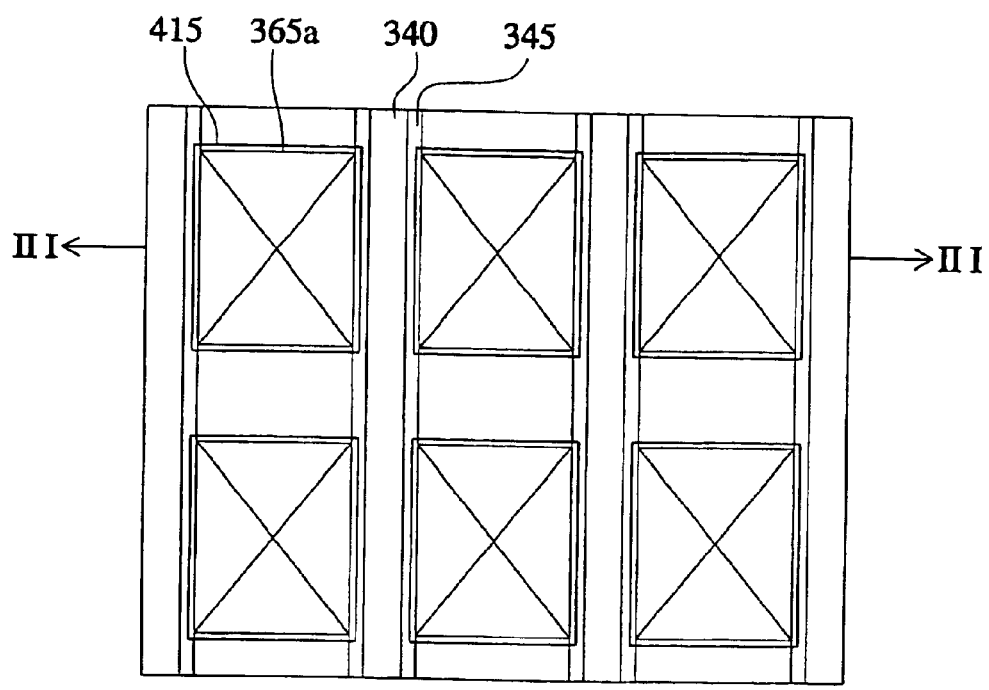
Figure 3D:
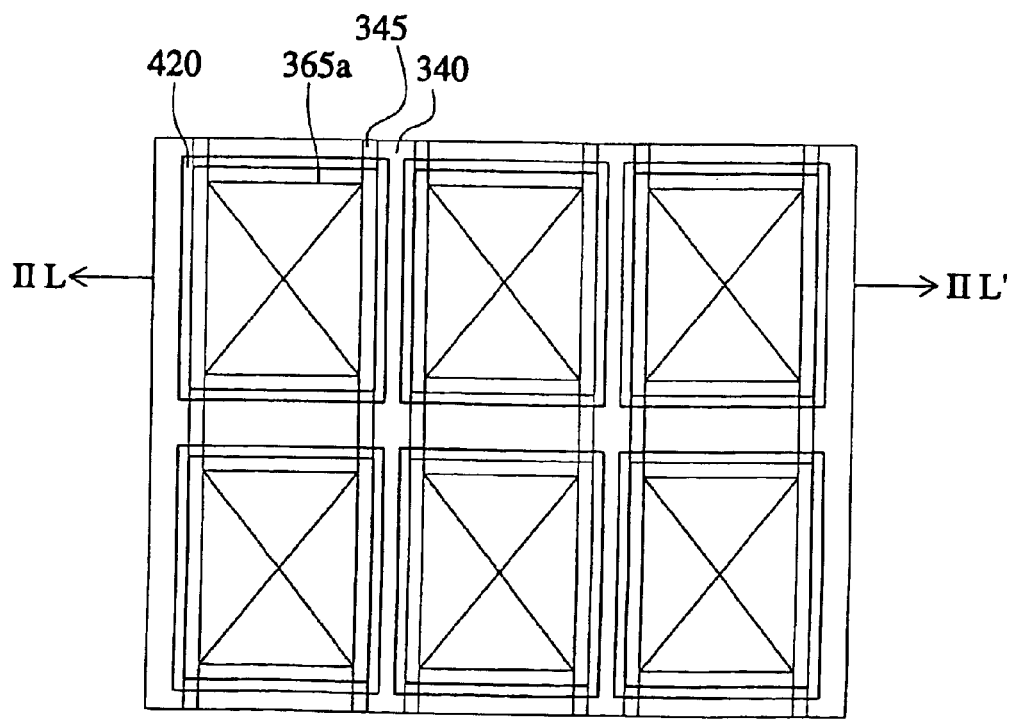

Referring to FIG. 2I, the insulating film 410 is etched to remain in a spacer type configuration at the edge portion of the insulating film 405, thereby supporting the insulating film 405. The insulating film 410 is etched up to the sacrificial insulating film 390, which is the etching end point. FIG. 3C is a plan diagram taken after the etch back process of the insulating film 410 is performed. FIG. 2I is a cross-sectional diagram taken along a line II I—II I of FIG. 3C. Referring to FIG. 3C, the insulating film 415 covers the insulating film 405. The insulating films 405 and 415 act as an etching mask 417 in the following process.

Figure 2J:
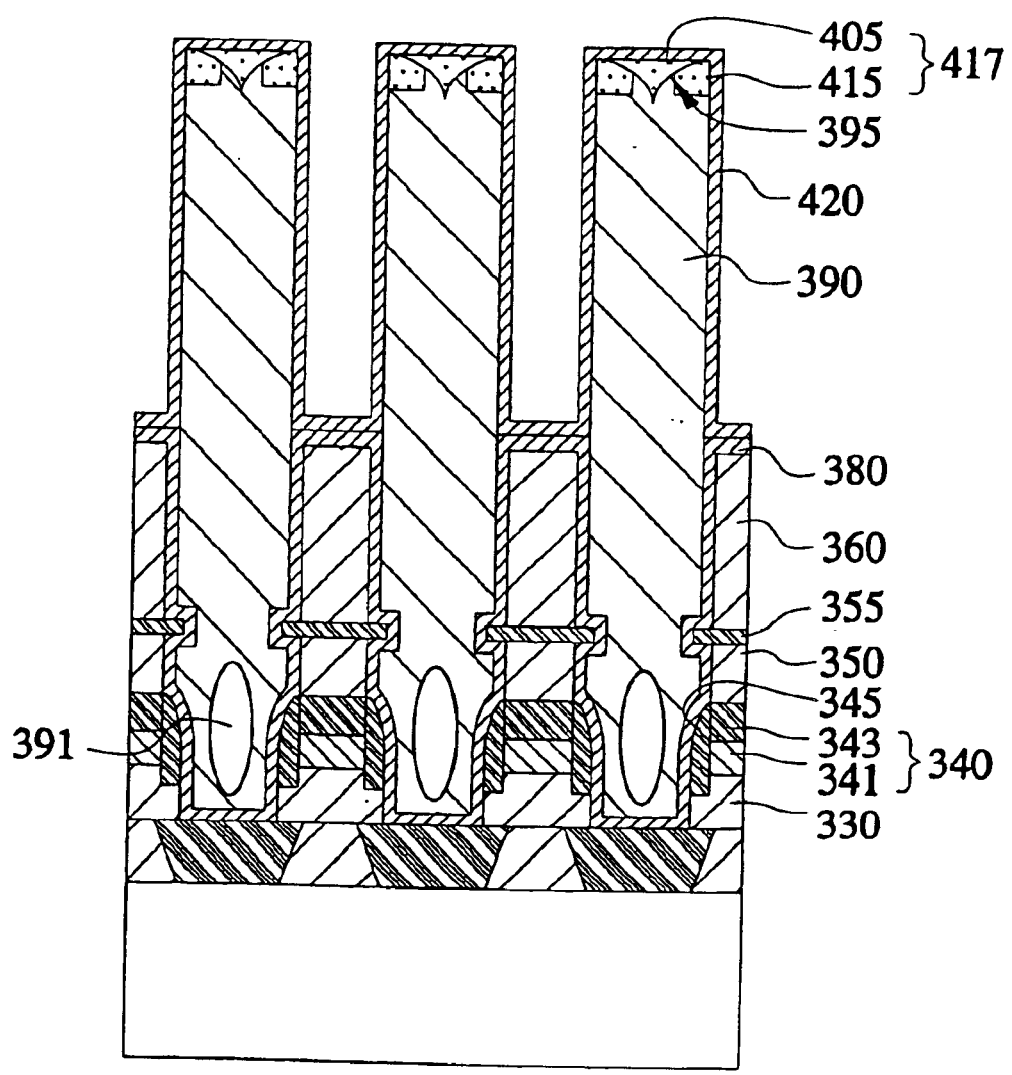

Referring to FIG. 2J, the exposed portion of the sacrificial insulating film 390 is etched using the etching mask 417 that includes the insulating films 405 and 415. The sacrificial insulating film 390 is dry etched up to the first polysilicon film 380 that is used as an etching end point. Next, a second polysilicon film 420 for a storage node is deposited to a thickness of about 200~500 Å on the substrate.

Figure 2K:
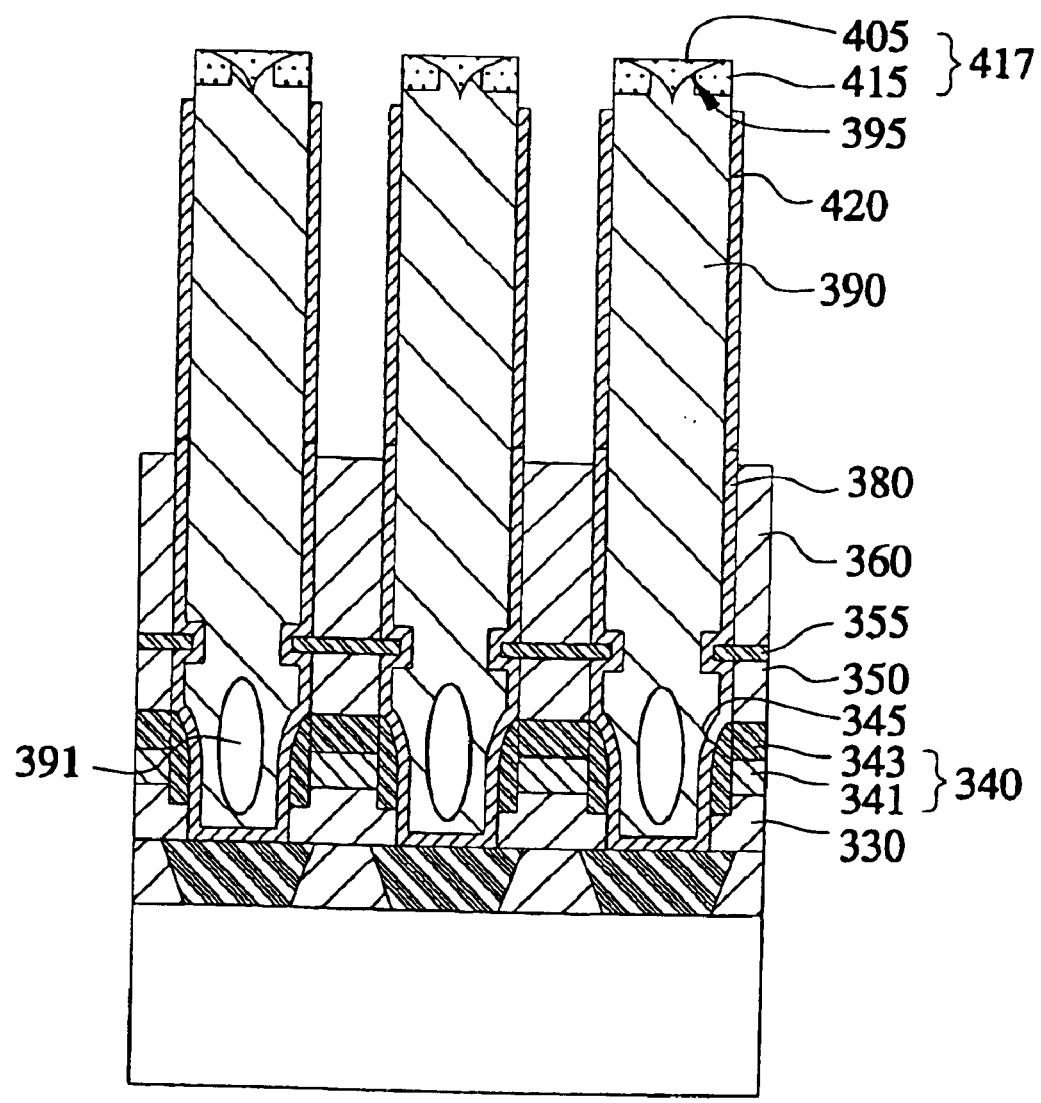

Referring to FIG. 2K, the first polysilicon film 380 and the second polysilicon film 420 is etched back to isolate nodes. At this time, the first and second polysilicon films 380 and 420 are etched back using the fourth interlayer insulating film 360 as an etching end point.

Figure 2L:
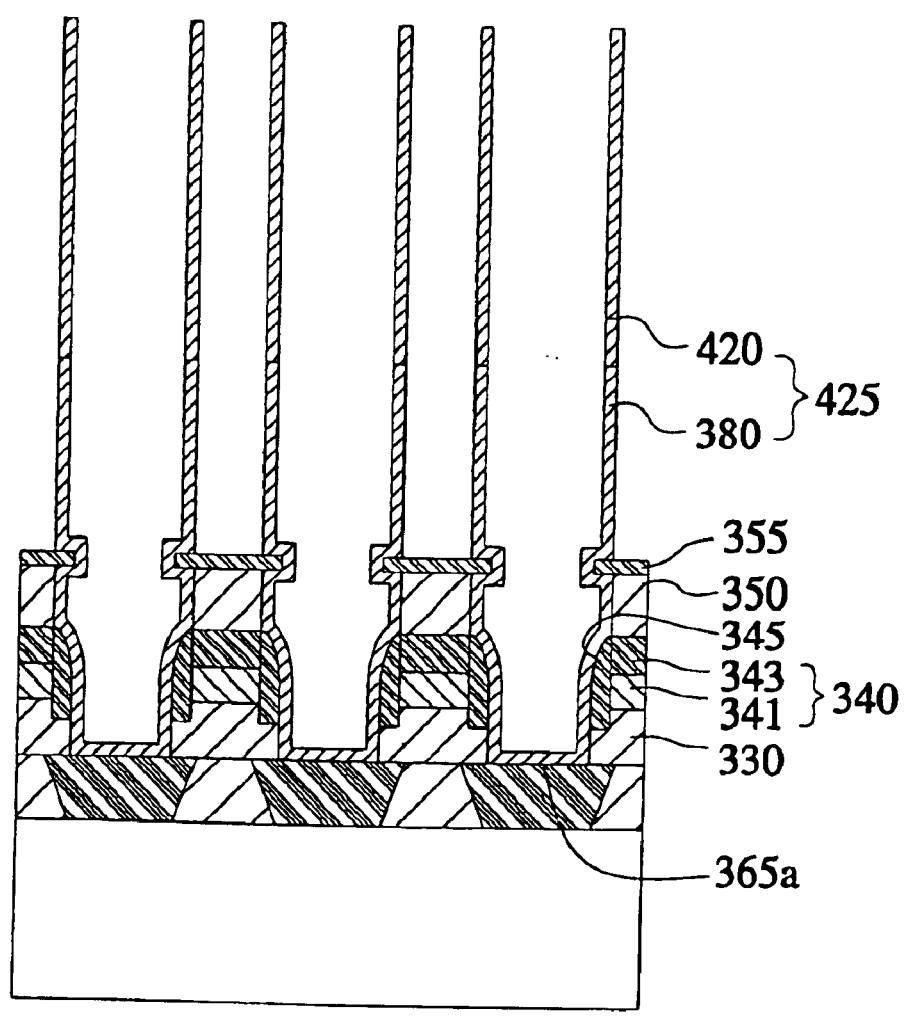

Referring to FIG. 2L, the etching mask 417 is removed by using phosphoric acid. Also, the sacrificial insulating film 390 and the fourth interlayer insulating film 360 are removed by using phosphoric acid, thereby forming a storage node 425 that includes the first and second polysilicon films 380 and 420.

According to an embodiment of the invention, the surface of the sacrificial insulating film 390 corresponding to the storage node contact 365a is recessed by the undulation of the storage node contact 365a. The sacrificial insulating film 390 is etched by using the etching mask layer 417 formed on the recessed portion 395 of the sacrificial insulating film 390. Accordingly, the photo etching process is excluded, and the storage node 425 is self-aligned with the storage node contact 365a.

The first polysilicon film 380 that is in direct contact with the storage node contact 365a is used as the storage node to increase the surface dimension of the storage node. The sacrificial insulating film 390 is etched by using the etching mask layer 417, and therefore, the surface dimension of the storage node is determined by the deposition thickness of the nitride film 415 that is used to form the etching mask layer 417.

According to an embodiment of the invention, the etching mask 417 is removed after node separation. The etching mask 417 may be removed before depositing the second polysilicon film 420. Finally, a capacitor of an OCS type is obtained by forming a dielectric film and a plate node on the substrate. These processes are not shown in the Figures since they are familiar to those skilled in the art.

As described above, according to an embodiment of the invention, a self-aligned storage node is formed by using the undulation of the upper surface of a sacrificial insulating film produced by a storage node contact, thereby solving the misalignment with the storage node contact owing to the photo etching process and reducing the manufacturing cost. Also, a surface dimension is increased by forming a storage node that directly contacts a storage node contact, thereby increasing the capacitance of a capacitor.

Embodiments of the invention will now be described in a non-limiting way.

A method for fabricating a semiconductor device according to an embodiment of the invention includes: preparing a semiconductor substrate having a contact pad; forming a first insulating film having a storage node contact exposing the contact pad on the substrate, the first insulating film having a stack structure of a bottom interlayer insulating film, an upper interlayer insulating film, and an etching stopper between the bottom and upper interlayer insulating films and protruding into the storage node contact; forming a first conductive film for a storage node on the substrate; forming a second insulating film where a portion of a surface corresponding to the storage node contact is recessed; forming an etching mask layer on the recessed portion of the second insulating film; etching the second insulating film using the etching mask layer; forming a second conductive film for a storage node on the substrate; etching the first and second conductive films to isolate nodes; and removing the etching mask layer, the second insulating film, and the upper interlayer insulating film.

According to an embodiment of the invention, the second insulating film is a film that copies an undulation of the second insulating film produced by the storage node contact at the bottom surface of the second insulating film, thereby recessing a portion of the top surface of the second insulating film corresponding to the storage node contact. The second insulating film may include a plasma oxide film or a high-density plasma oxide film.

According to an embodiment of the invention, forming the etching mask layer includes: depositing a first etching mask material on the second insulating film to fill the recessed portion of the second insulating film; etching the first etching mask material to remain at the recessed portion of the second insulating film; dry-etching the second insulating film using the first etching mask material; wet-etching the second insulating film using the first etching mask material; depositing a second etching mask material on the substrate; and etching the second etching mask material to remain at an edge portion of the first etching mask material.

While the invention has been particularly shown and described with reference to a preferred embodiment thereof, it will be understood by those skilled in the art that the foregoing and other changes in form and details may be made therein without departing from the spirit and scope of the invention as defined in the claims below.

What is claimed is:

1. A method for fabricating a semiconductor device, comprising:

preparing a semiconductor substrate having a contact pad;

forming a first insulating film having a storage node contact exposing the contact pad and having a stack structure of an upper interlayer insulating film, a bottom interlayer insulating film, and an etching stopper that is between the upper and bottom interlayer insulating films and that protrudes into the storage node contact;

forming a first conductive film for a storage node on the substrate;

forming a second insulating film with a recessed portion corresponding to a surface of the storage node contact;

forming an etching mask layer on the recessed portion;

etching the second insulating film using the etching mask layer;

forming a second conductive film for a storage node on the substrate;

etching the first and second conductive films to isolate nodes; and removing the etching mask layer, the second insulating film, and the upper interlayer insulating film.

2. The method according to claim 1, wherein the second insulating film is a film that copies an undulation of the second insulating film produced by the storage node contact on the surface of the second insulating film, thereby recessing the portion of the surface of the second insulating film corresponding to the storage node contact.

3. The method according to claim 2, wherein the second insulating film comprises one chosen from the group consisting of a plasma oxide film and a high-density plasma oxide film.

4. The method according to claim 1, wherein forming the etching mask layer on the recessed portion comprises forming a nitride film.

5. The method according to claim 1, wherein forming the etching mask layer on the recessed portion comprises:

depositing a first etching mask material on the second insulating film to fill the recessed portion of the second insulating film; and etching the first etching mask material to remain at the recessed portion of the second insulating film.

6. The method according to claim 5, wherein etching the first etching mask material comprises etching with a CMP process that uses the second insulating film as an etching end point.

7. The method according to claim 5, wherein forming the etching mask layer on the recessed portion further comprises:

dry-etching the second insulating film using the first etching mask material;

wet-etching the second insulating film using the first etching mask material;

depositing a second etching mask material on the substrate; and etching the second etching mask material to remain on an edge portion of the first etching mask material.

8. The method according to claim 7, wherein the second etching mask material acts as a support for the first etching mask material.

9. The method according to claim 7, wherein etching the second etching mask material comprises etching with an etch back process that uses the second insulating film as an etching end point.

10. The method according to claim 7, wherein the second insulating film comprises an oxide film and the first and second etching mask materials comprise a nitride film.

11. The method according to claim 7, wherein a surface dimension of the storage node is determined by a deposition thickness of the second etching mask material.

12. The method according to claim 7, wherein the second insulating layer is etched to a thickness of about 100 Å to 300 Å within the extent that the first etching mask material is not lifted.

13. The method according to claim 1, wherein etching the second insulating film using the etching mask layer comprises etching until the first conductive film for a storage node is exposed.

14. The method according to claim 1, wherein forming the first conductive film for a storage node comprises forming a conductive material to a minimum thickness, preferably about 200 Å to 500 Å, so as not to completely fill the storage node contact.

* * * * *